United States Patent
Homma et al.

(10) Patent No.: US 8,189,655 B2
(45) Date of Patent: May 29, 2012

(54) DIGITAL AMPLIFIER

(75) Inventors: Ryota Homma, Kanagawa (JP); Koji Kudo, Kanagawa (JP)

(73) Assignee: Panasonic Corporation, Osaka (JP)

( * ) Notice: Subject to any disclaimer, the term of this patent is extended or adjusted under 35 U.S.C. 154(b) by 552 days.

(21) Appl. No.: 12/439,124

(22) PCT Filed: Aug. 28, 2007

(86) PCT No.: PCT/JP2007/066661
§ 371 (c)(1),
(2), (4) Date: Feb. 26, 2009

(87) PCT Pub. No.: WO2008/026585
PCT Pub. Date: Mar. 6, 2008

(65) Prior Publication Data
US 2010/0014574 A1    Jan. 21, 2010

(30) Foreign Application Priority Data
Aug. 29, 2006  (JP) .................. 2006-232442

(51) Int. Cl.
H03K 7/08  (2006.01)

(52) U.S. Cl. ........ 375/238; 375/316; 375/326; 375/340; 455/67.13; 455/71; 455/232.1; 455/234.1; 455/245.1; 455/296; 455/310; 455/552.1; 330/10; 330/251

(58) Field of Classification Search .......... 375/238, 375/316, 326, 340; 455/71, 67.13, 232.1, 455/234.1, 245.1, 296, 310, 552.1; 330/10, 330/251
See application file for complete search history.

(56) References Cited

U.S. PATENT DOCUMENTS 6,819,912 B2 * 11/2004 Roeckner et al. .......... 455/296
7,110,737 B2 * 9/2006 Sawashi et al. .......... 455/245.1
2003/0042976 A1  3/2003 Midya
2003/0087621 A1  5/2003 Roeckner
(Continued)

FOREIGN PATENT DOCUMENTS

JP  9-260967  10/1997
(Continued)

OTHER PUBLICATIONS

International Search Report dated Oct. 9, 2007.
(Continued)

Primary Examiner — Leon Flores
(74) Attorney, Agent, or Firm — Dickinson Wright PLLC

(57) ABSTRACT

A digital amplifier amplifies an input signal from a tuner (107) which receives a broadcast wave of a set receiving frequency so as to suppress degradation of the high-band reproduction performance and lowering of the amplification efficiency. The digital amplifier includes: a band division unit (102) for dividing an input signal into a plurality of bands; a high-band pulse width modulation unit (103a) and a low-band pulse width modulation unit (103b) which modulate the input signal of the respective bands divided by the band division unit (102), by the pulse width modulation method; a switching frequency control unit (101) which obtains a receiving frequency in the tuner (107) and controls a switching frequency (fsa) in the high-band pulse width modulation unit (103a) and a switching frequency (fsb) in the low-band pulse width modulation unit (103b); and a high-band amplification unit (104a) and a low-band amplification unit (104b) which amplify the input signal which has been subjected to pulse width modulation by the high-band pulse width modulation unit (103a) and the low-band pulse width modulation unit (103b).

7 Claims, 11 Drawing Sheets

U.S. PATENT DOCUMENTS

2003/0194971 A1   10/2003   Hoyt
2003/0216132 A1   11/2003   Sawashi

FOREIGN PATENT DOCUMENTS

| | | |
|---|---|---|
| JP | 11-274863 | 10/1999 |
| JP | 2004-48333 | 2/2004 |
| JP | 2004-48701 | 2/2004 |
| JP | 2004-363771 | 12/2004 |
| JP | 2005-51289 | 2/2005 |
| JP | 2005-509338 | 4/2005 |
| JP | 2006-121425 | 5/2006 |

OTHER PUBLICATIONS

Extended European Search Report dated Dec. 29, 2011.
Japanese Office Action dated Feb. 14, 2012.
K. Nielsen, "High-Fidelity PWM-Based Amplifier Concept for Active Loudspeaker Systems with Very Low Energy Consumption," Audio Engineering Society, vol. 45, No. 7/8, XP040377404, Aug. 30, 1997, pp. 554-570.

* cited by examiner

| RECEIVING FREQUENCY fo | SWITCHING FREQUENCY fsa | SWITCHING FREQUENCY fsb |
|---|---|---|
| fo1 | fsa1 | fsb1 |
| fo2 | fsa2 | fsb2 |
| fo3 | fsa3 | fsb3 |
| fo4 | fsa4 | fsb4 |
| . | . | . |
| . | . | . |

FIG.5

DIGITAL AMPLIFIER

TECHNICAL FIELD

The present invention relates to a digital amplifier apparatus for amplifying at least an input signal from a tuner by a class D amplification scheme.

BACKGROUND ART

As shown, for example, in FIG. 1, a conventional digital amplifier apparatus 10 of this type (hereinafter simply referred to as a "digital amplifier") is configured with a pulse width modulation section 11, an amplification section 12 and a lowpass filter (hereinafter abbreviated as "LPF") 13.

Referring to FIG. 1, the pulse width modulation section 11 modulates an input signal from a tuner 15 connected to an antenna 14 by a pulse width modulation scheme.

The amplification section 12 amplifies by switching operation the output signal subjected to pulse width modulation in the pulse width modulation section 11.

The LPF 13 removes the high frequencies produced by the switching operation, and outputs the output signal to a speaker 16 connected to the digital amplifier apparatus 10.

However, with this conventional digital amplifier 10, if the switching frequency is in the receiving frequency band of the tuner 15, the switching frequency produces noise (hereinafter referred to as "switching noise") and consequently may cause reception malfunctions in the tuner 15.

As a solution to such malfunctions, a digital amplifier 20 provided with a switching frequency control section 21 for controlling the switching frequency variably based on tuning detection signals provided from the tuner 15, has been known conventionally, as shown in FIG. 2 (e.g., see Patent Document 1).

Patent Document 1: Japanese Patent Application Laid-Open No. 2004-363771

DISCLOSURE OF INVENTION

Problems to be Solved by the Invention

However, with the above conventional digital amplifier 20, there are no other methods to prevent reception malfunctions in the tuner 15 than setting the switching frequency in a band that does not influence the receiving frequency.

For this reason, with the conventional digital amplifier 20, there is a problem that, if the switching frequency is set low enough not to influence the receiving frequency, the playback performance of high band output from the speaker 16 deteriorates.

Furthermore, with the conventional digital amplifier 20, there is another problem that, if the switching frequency is set high enough not to influence the receiving frequency, the efficiency of amplification in the amplifier decreases.

It is therefore an object of the present invention to provide a digital amplifier that is able to eliminate reception malfunctions caused in a tuner by switching noise and suppress deterioration of high-band playback performance and a decrease in amplification efficiency.

Means for Solving the Problem

In order to achieve the above object, the digital amplifier of the present invention amplifies an input signal from a tuner receiving a broadcast signal of a set receiving frequency, and employs a configuration having: a band division section that divides the input signal into a plurality of bands; a pulse width modulation section that modulates the bands of the input signal divided in the band division section by a pulse width modulation scheme; a switching frequency control section that acquires the receiving frequency in the tuner and controls switching frequencies in the pulse width modulation section; and an amplification section that amplifies the input signal subjected to pulse width modulation in the pulse width modulation section.

Advantageous Effect of the Invention

According to the present invention, it is possible to divide an input signal into a lower band and a higher band, and, during tuner operation, set a switching frequency low enough not to influence the receiving frequency with respect to the lower band part of the input signal, and set a switching frequency high enough not to influence the receiving frequency with respect to the higher band part of the input signal. By setting switching frequencies this way, compared to a case where switching is performed at a low frequency over the entire band of an input signal, a low switching frequency applies only to the lower band part, so that it is possible to suppress deterioration of playback performance of the higher band part. Furthermore, compared to a case where switching is performed at a low frequency over the entire band of an input signal, it is possible to set the switching frequency for the lower band part low and improve amplification efficiency.

BRIEF DESCRIPTION OF THE DRAWINGS

FIG. 5 shows a table held in the switching frequency control section in the digital amplifier according to Embodiment 1 of the present invention;

BEST MODE FOR CARRYING OUT THE INVENTION

Figure 1:
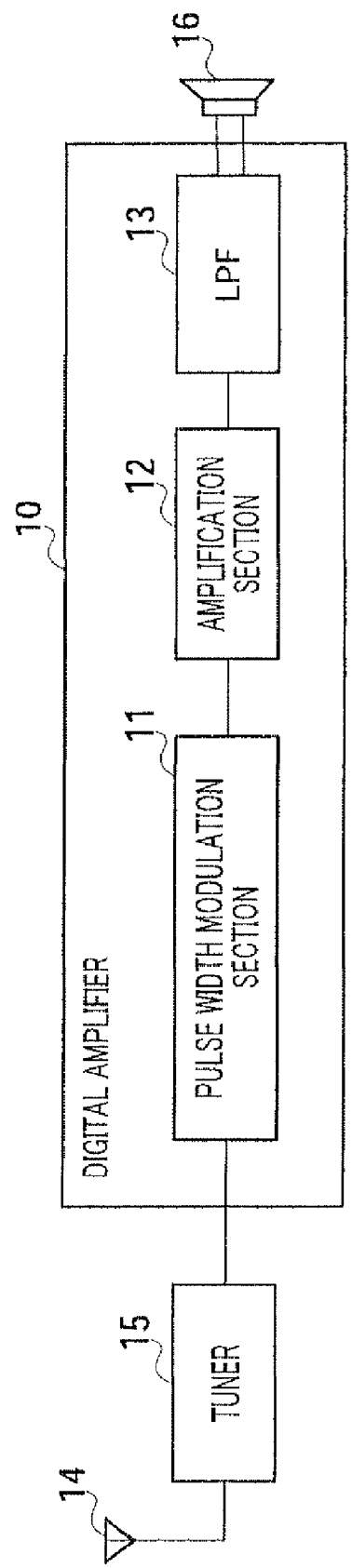
FIG. 1 is a block diagram showing a configuration of a conventional digital amplifier.
Figure 2:
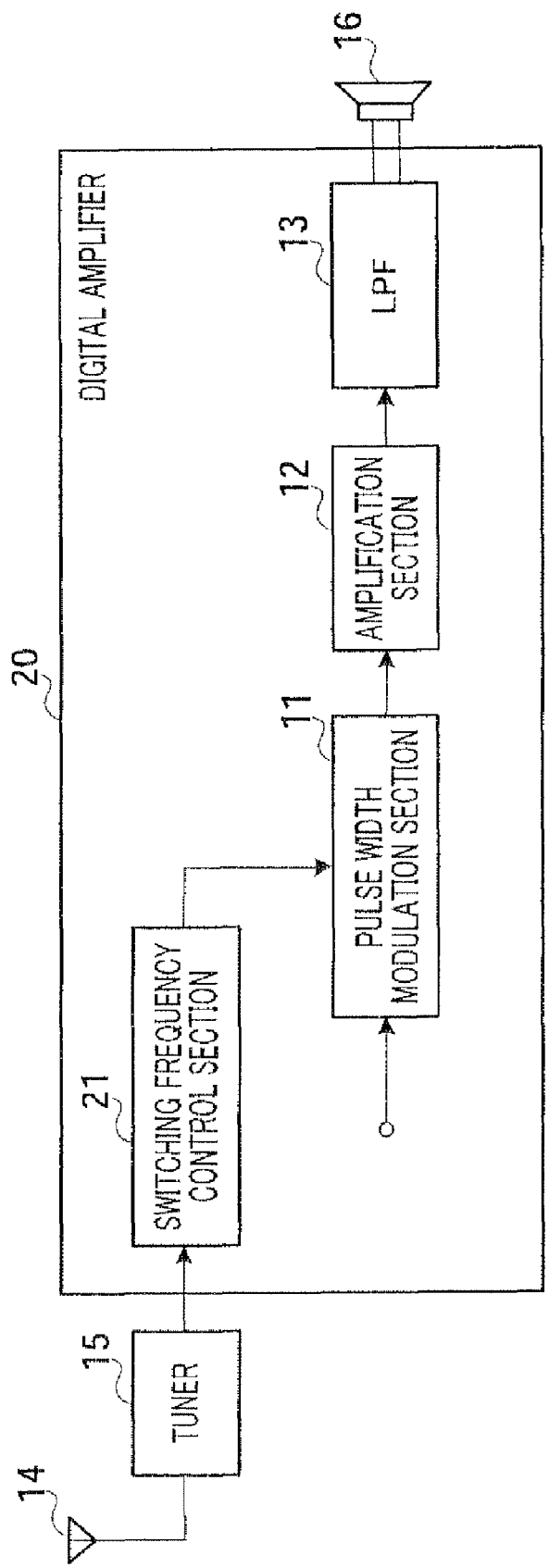
FIG. 2 is a block diagram showing a configuration of a conventional digital amplifier for preventing reception malfunctions in a tuner.

Now, digital amplifiers according to embodiments of the present invention will be described below in detail with reference to the accompanying drawings. Components and corresponding parts having the same configurations or functions in the drawings will be assigned the same reference numerals and explanations thereof will not be repeated.
(Embodiment) 1

Figure 3:
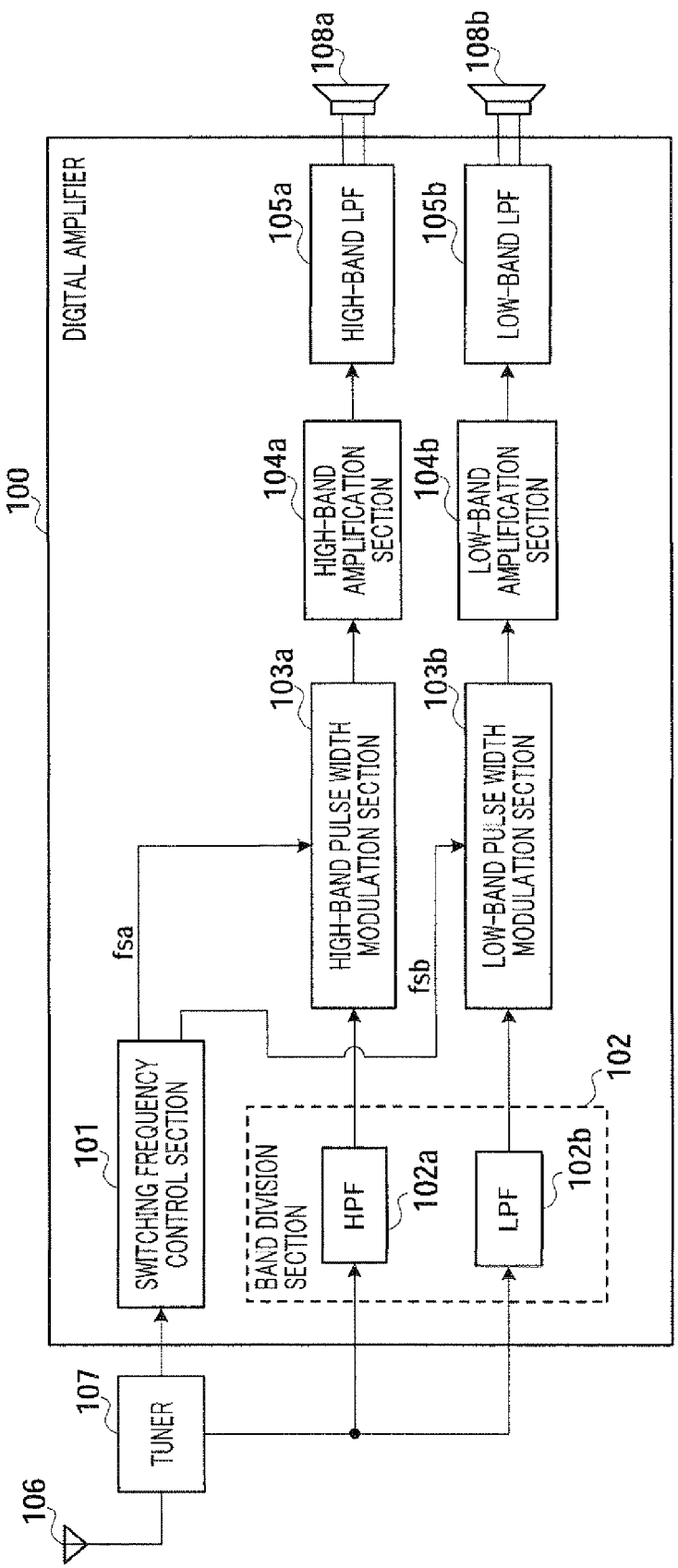
FIG. 3 is a block diagram showing an internal configuration of a digital amplifier according to Embodiment 1 of the present invention, and its peripheral configurations.

FIG. 3 is a block diagram showing an internal configuration of a digital amplifier according to Embodiment 1 of the present invention, and its peripheral configurations.

As shown in FIG. 3, a tuner 107 connected to an antenna 106, a high-hand playback speaker 108a and a low-band playback speaker 108b are connected to a digital amplifier 100 of the present embodiment.

Referring to FIG. 3, the tuner 107 receives, for example, the broadcast wave of a channel (frequency) specified by the user through the antenna 106, and outputs the demodulated signal of the received signal and information indicating the current receiving frequency fo (hereinafter simply referred to as "receiving frequency information"), to the digital amplifier 100.

The digital amplifier 100 of the present embodiment is provided with a switching frequency control section 101, a band division section 102, a high-band pulse width modulation section 103a, a low-band pulse width modulation section 103b, a high-band amplification section 104a, a low-band amplification section 104b, a high-band LPF 105a and a low-band LPF 105b.

The switching frequency control section 101 determines a switching frequency fsa for the higher band and a switching frequency fsb for the lower band, based on receiving frequency information from the tuner 107, and reports these determined frequencies to the high-band pulse width modulation section 103a and the low-band pulse width modulation section 103b. The processing in this switching frequency control section 101 will be later described in detail with reference to FIG. 4.

The band division section 102 includes a high pass filter (hereinafter abbreviated as "HPF") 102a that allows to pass higher frequency components of the output signal from the tuner 107 and an LPF 102b that allows to pass lower frequency component of the output signal from the tuner 107.

The high-band pulse width modulation section 103a operates in the switching frequency fsa for the higher band specified by the switching frequency control section 101, and performs pulse width modulation of the output signal of the HPF 102a in the band division section 102.

The high-band amplification section 104a performs class D amplification of the output signal of the high-band pulse width modulation section 103a.

The high-band LPF 105a allows to pass lower frequency components included in the output signal of the high-band amplification section 104a, to remove the high frequencies produced by the switching operation. The output signal of the high-band LPF 105a is outputted to a high-band playback speaker 108a.

The high-band playback speaker 108a outputs high-frequency sounds based on the input signal.

On the other hand, the low-band pulse width modulation section 103b operates in the switching frequency fsb for the lower band specified by the switching frequency control section 101, and performs pulse width modulation of the output signal of the LPF 102b in the band division section 102.

The low-band amplification section 104b performs class D amplification of the output signal of the low-band pulse width modulation section 103b.

The low-band LPF 105b allows to pass lower frequency components included in the output signal of the low-band amplification section 104b, to remove the high frequencies produced by switching operation. The output signal of the low-band LPF 105b is outputted to a low-band playback speaker 108b.

The low-band playback speaker 108b outputs low-frequency sounds based on the input signal.

Next, the processing in the switching frequency control section 101 in the digital amplifier 100 of the present embodiment will be described using the flowchart shown in FIG. 4.

Figure 4:
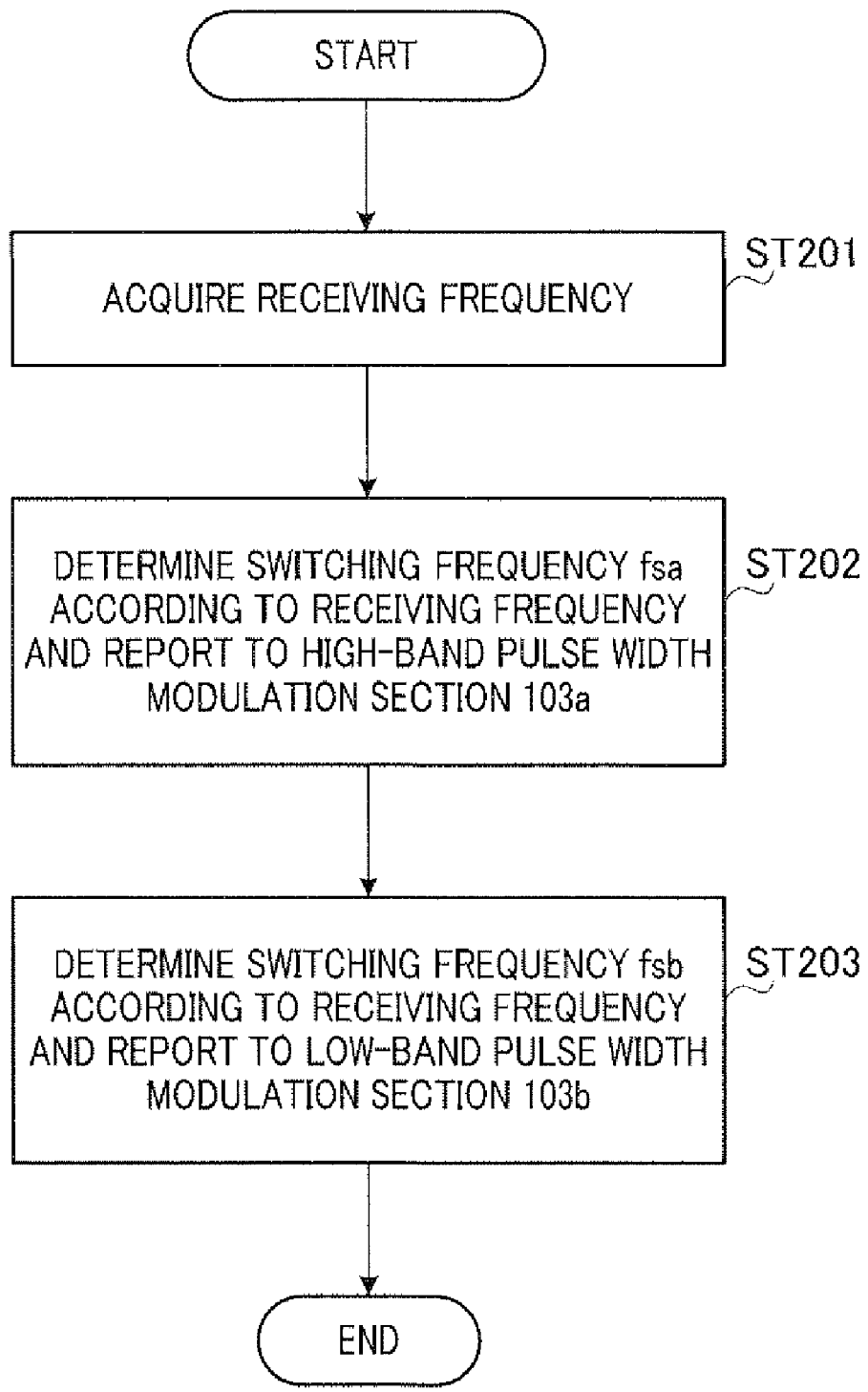
FIG. 4 is a flowchart showing processing in a switching frequency control section in the digital amplifier according to Embodiment 1 of the present invention.

Referring to FIG. 4, when the processing starts, the switching frequency control section 101 acquires receiving frequency information from the tuner 107 (step ST201).

Next, based on the receiving frequency information acquired from the tuner 107, the switching frequency control section 101 determines a switching frequency fsa for the higher band that is high enough not to influence the receiving frequency in the tuner 107, and reports the determined switching frequency fsa for the higher band to the high-band pulse width modulation section 103a (step ST202).

In addition, based on the receiving frequency information from the tuner 107, the switching frequency control section 101 determines a switching frequency fsb for the lower band that is low enough not to influence the receiving frequency in the tuner 107, and reports the determined switching frequency fsb for the lower band to the low-band pulse width modulation section 103b (step ST203).

Here, the switching frequency fsa for the higher band and the switching frequency fsb for the lower band that do not influence the receiving frequency, refer to such frequencies that these frequencies fsa and fsb and the frequencies of their m/n multiples (where n and m are integers) do not overlap with the current receiving frequency fo and the beat noise produced by these frequencies fsa and fsb and the frequencies of their m/n multiples do not influence the audio band (i.e. 20 Hz to 20 kHz).

If, for example, the receiving frequency fo in the tuner 107 is 930 kHz, the switching frequency fsa for the higher band is set to 384 kHz and the switching frequency fsb for the lower band is set to 96 kHz, which is lower than the receiving frequency fo.

By setting the switching frequency fsa for the higher band and the switching frequency fsb for the lower band in such a manner, it is possible to suppress the influence of switching noise upon the tuner 107.

Combinations of the switching frequency fsa for the higher band and the switching frequency fsb for the lower band, whereby influence upon the tuner 107 can be suppressed, are determined in advance in accordance with the receiving frequency fo.

In the digital amplifier 100 of the present embodiment, for example, as shown in FIG. 5, the switching frequency control section 101 stores a table T, in which the receiving frequency fo and combinations of the switching frequency fsa for the higher band and the switching frequency fsb for the lower band are linked in one-to-one associations.

The switching frequency control section 101 then selects, in step ST202 and step ST203 in FIG. 4, the combination of a switching frequency fsa for the higher band and the switching frequency fsb for the lower band associated with the receiving frequency fo indicated by receiving frequency information from the tuner 107, and reports the switching frequency fsa and the switching frequency fsb to the high-band pulse width modulation section 103a and the low-band pulse width modulation section 103b.

In the digital amplifier 100 of the above configuration, a received signal in the tuner 107 is divided into higher frequency components and lower frequency components, through the HPF 102a and the LPF 102b in the band division section 102.

Figure 6:
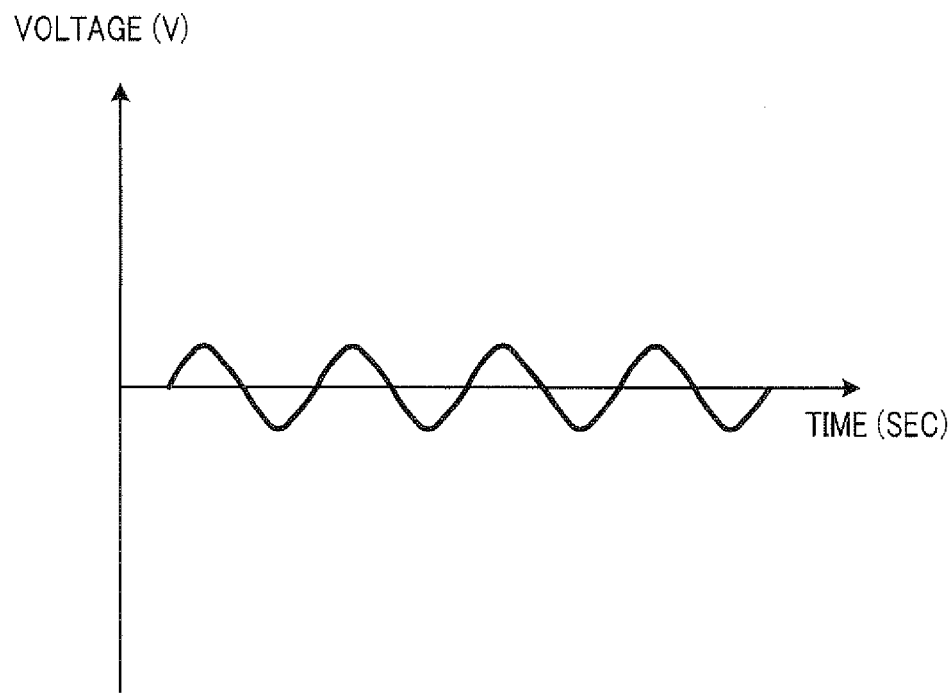
FIG. 6 is an output waveform diagram of a HPF in a band division section in the digital amplifier according to Embodiment 1 of the present invention.

The high-band pulse width modulation section 103a performs pulse width modulation of the higher frequency signal (see FIG. 6) divided by the HPF 102a in the band division section 102, using the switching frequency fsa determined in the switching frequency control section 101.

Figure 7:
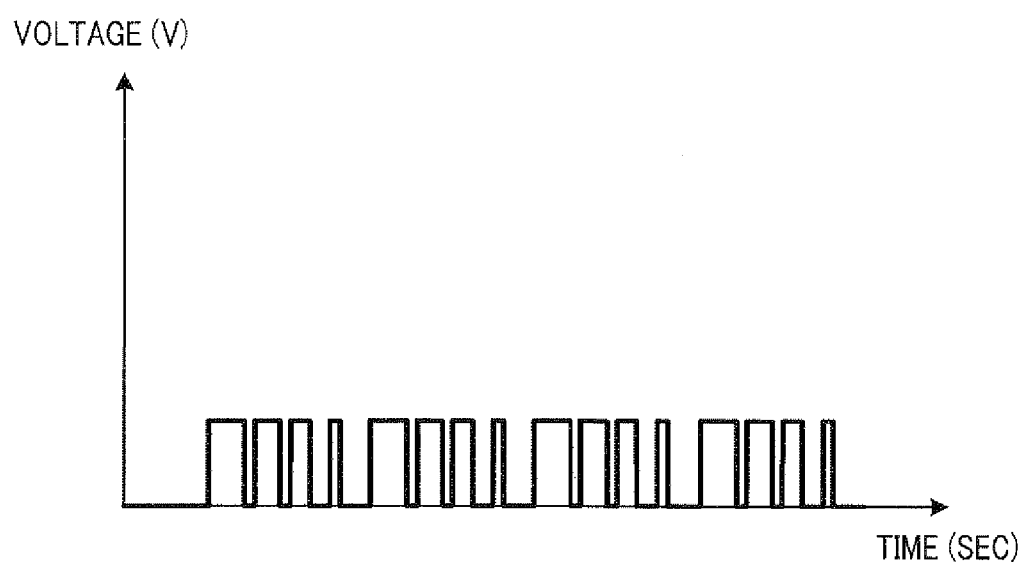
FIG. 7 is an output waveform diagram of a high-band pulse width modulation section in the digital amplifier according to Embodiment 1 of the present invention.

The high-band amplification section 104a amplifies, by switching operation, the output signal subjected to pulse width modulation in the high-band pulse width modulation section 103a (see FIG. 7).

Figure 8:
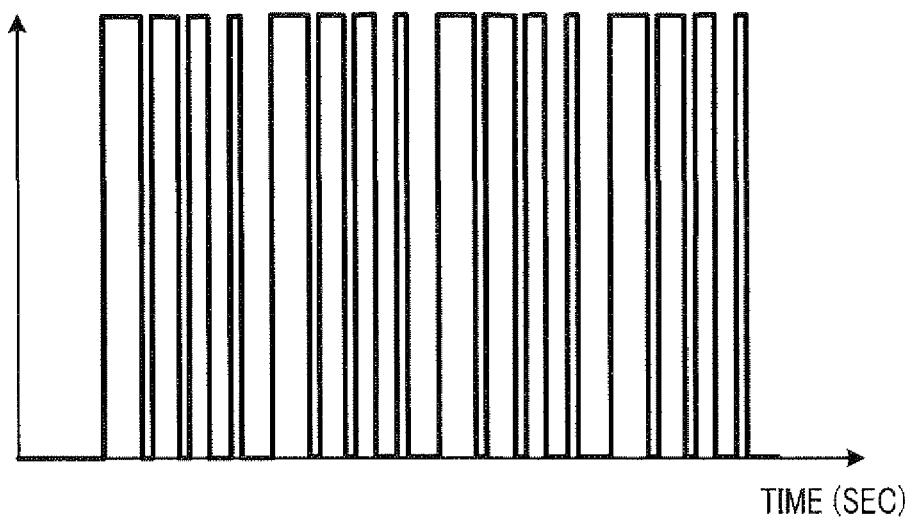
FIG. 8 is an output waveform diagram of the high-band amplification section in the digital amplifier according to Embodiment 1 of the present invention.
Figure 9:
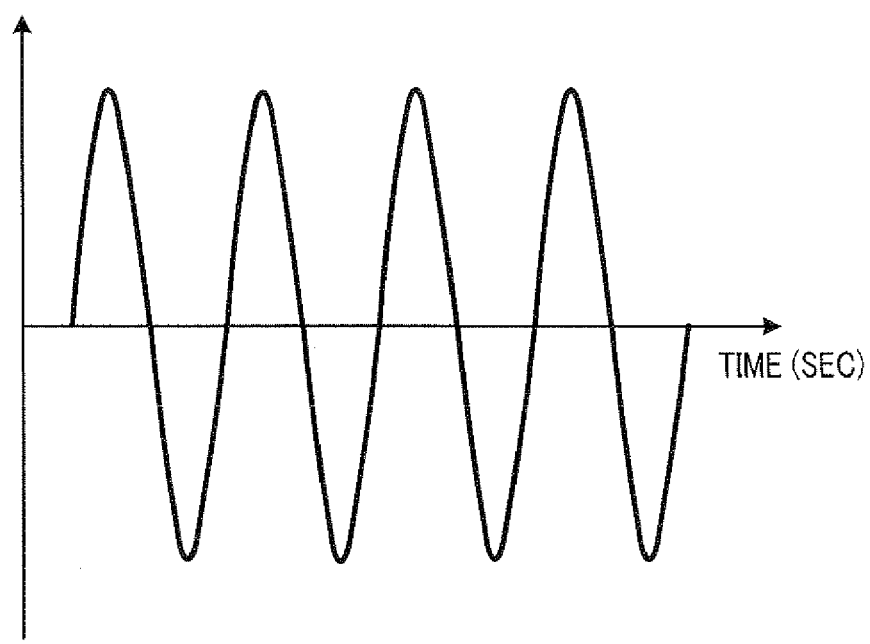
FIG. 9 is an output waveform diagram of a high-band LPF in the digital amplifier according to Embodiment 1 of the present invention.

The high-band LPF 105a removes the high frequencies produced by the switching operation, from the signal amplified in the high-band amplification section 104a (see FIG. 8), demodulates the signal, and outputs the demodulated signal (see FIG. 9) to the high-band playback speaker 108a.

Figure 10:
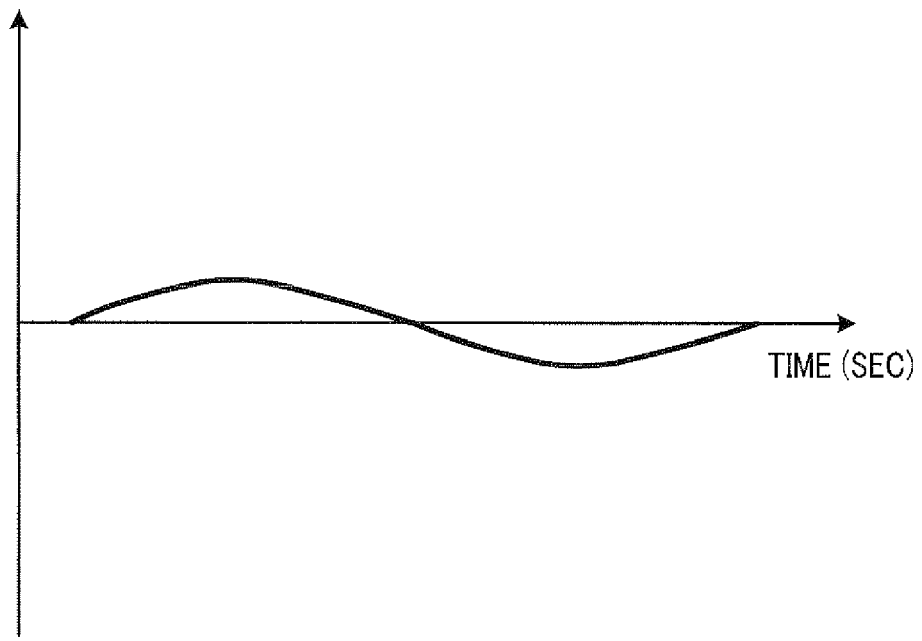
FIG. 10 is an output waveform diagram of the LPF in the band division section in the digital amplifier according to Embodiment 1 of the present invention.

In addition, the low-band pulse width modulation section 103b performs pulse width modulation of the lower frequency signal (see FIG. 10) divided by the LPF 102b in the band division section 102, using the switching frequency fsb determined in the switching frequency control section 101, which is different from the switching frequency fsa.

Figure 11:
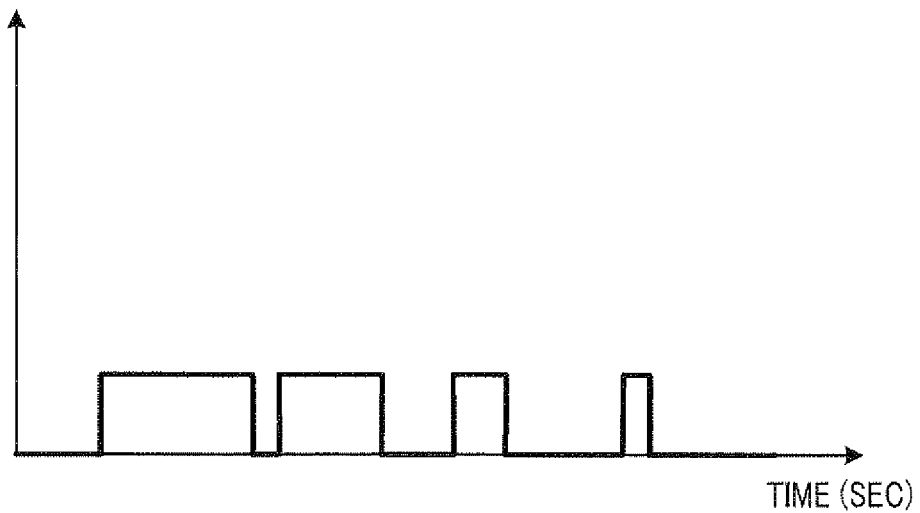
FIG. 11 is an output waveform diagram of a low-band pulse width modulation section in the digital amplifier according to Embodiment 1 of the present invention.

The low-band amplification section 104b amplifies, by switching operation, the output signal subjected to pulse width modulation in the low-band pulse width modulation section 103b (see FIG. 11).

Figure 12:
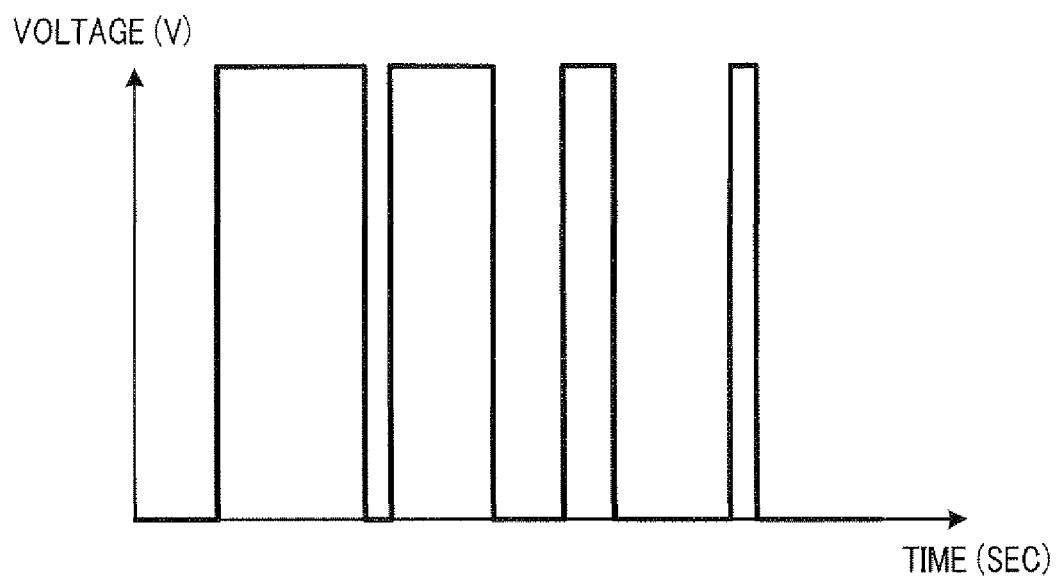
FIG. 12 is an output waveform diagram of a low-band amplification section in the digital amplifier according to Embodiment 1 of the present invention.
Figure 13:
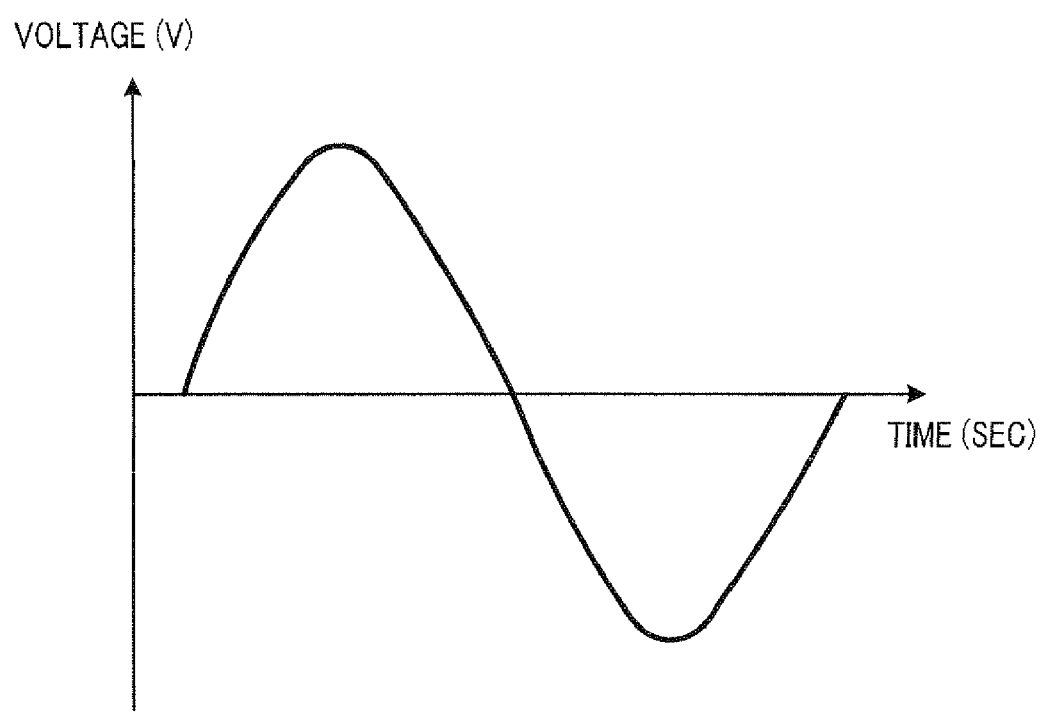
FIG. 13 is an output waveform diagram of a low-band LPF in the digital amplifier according to Embodiment 1 of the present invention.

The low-band LPF 105b removes the high frequencies produced by the switching operation, from the signal amplified in the low-band amplification section 104b (see FIG. 12), demodulates the signal, and outputs the demodulated signal (see FIG. 13) to the low-band playback speaker 108b.

Thus, with the digital amplifier 100 of the present embodiment, as for the higher band of a received signal in the tuner 107, switching is performed at a switching frequency fsa that is high enough not to influence the receiving frequency fo in the tuner 107, to suppress deterioration of playback performance, and, as for the lower band, switching is performed at a switching frequency fsb that is low enough not to influence the receiving frequency fo, to improve the efficiency of amplification.

Although a case has been presented in the above description where the received signal is divided in the band division section 102 into two, that is, into the higher band and the lower band, it is equally possible to divide the band into three or more in the band division section 102.

Furthermore, in the above description, the switching frequency control section 101 determines the switching frequency fsa and the switching frequency fsb using the table T shown in FIG. 5. This is nevertheless not limiting, and the switching frequency control section 101 may equally make the receiving frequency fsa variable, store equations for finding the switching frequency fsa and the switching frequency fsb, and, upon receiving frequency information from the tuner 107, substitute the receiving frequency fo in these equations and find the switching frequency fsa and the switching frequency fsb.

(Embodiment) 2

Figure 14:
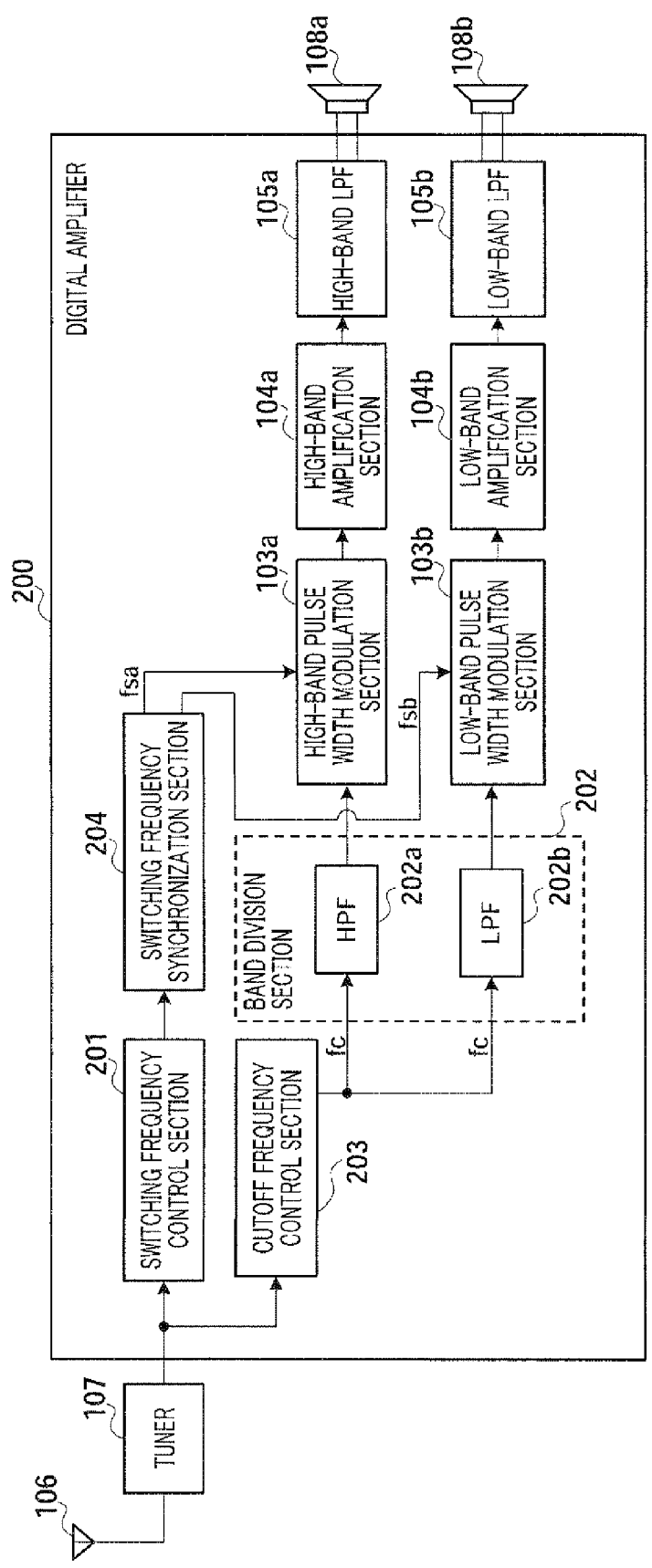
FIG. 14 is a block diagram showing an internal configuration of a digital amplifier according to Embodiment 2 of the present invention, and its peripheral configurations.

FIG. 14 is a block diagram showing an internal configuration of a digital amplifier according to Embodiment 2 of the present invention and its peripheral configurations.

As shown in FIG. 14, in comparison to the digital amplifier 100 according to Embodiment 1, a digital amplifier 200 of the present embodiment is unique in having a switching frequency control section 201 instead of the switching frequency control section 101 and having a HPF 202a and a LPF 202b in a band division section 202 instead of the HPF 102a and the LPF 102b in the band division section 102.

Furthermore, in comparison to the digital amplifier 100 according to Embodiment 1, the digital amplifier 200 of the present embodiment is unique in additionally having a cutoff frequency control section 203 and a switching frequency synchronization section 204.

In addition, the high-band pulse width modulation section 103a and the low-band pulse width modulation section 103b, the high-band amplification section 104a and the low-band amplification section 104b, the high-band LPF 105a and the low-band LPF 105b of the digital amplifier 200 of the present embodiment and the digital amplifier 100 according to Embodiment 1 have the same processing functions, respectively, and therefore their explanations will be omitted.

Referring to FIG. 14, the switching frequency control section 201 determines a switching frequency fsa for the higher band and a switching frequency fsc for the lower hand, based on the receiving frequency from the tuner 107, and gives the determined frequencies to a switching frequency synchronization section 204. The processing in this switching frequency control section 201 will be later described in detail with reference to FIG. 15.

The HPF 202a in the band division section 202 allows to pass frequency bands equal to or higher than the cutoff frequency fc set in the cutoff frequency control section 203.

The LPF 202b in the band division section 202 allows to pass frequency bands equal to or lower than the cutoff frequency fc set in the cutoff frequency control section 203.

Based on the receiving frequency fo from the tuner 107, the cutoff frequency control section 203 determines the cutoff frequency fc and sets the determined cutoff frequency fc in the HPF 202a and the LPF 202b in the band division section 202, respectively.

The switching frequency synchronization section 204 sets the switching frequency fsa for the higher band determined in the switching frequency control section 201 in the high-band pulse width modulation section 103a, and sets the switching frequency fsc for the lower band determined in the switching frequency control section 201 in the low-band pulse width modulation section 103b.

In addition, the switching frequency synchronization section 204 establishes switching synchronization between the high-band pulse width modulation section 103a and the low-band pulse width modulation section 103b.

Next, the processing in the switching frequency control section 201, the cutoff frequency control section 203 and the switching frequency synchronization section 204 in the digital amplifier 200 of the present embodiment will be described using the flowchart shown in FIG. 15.

Figure 15:
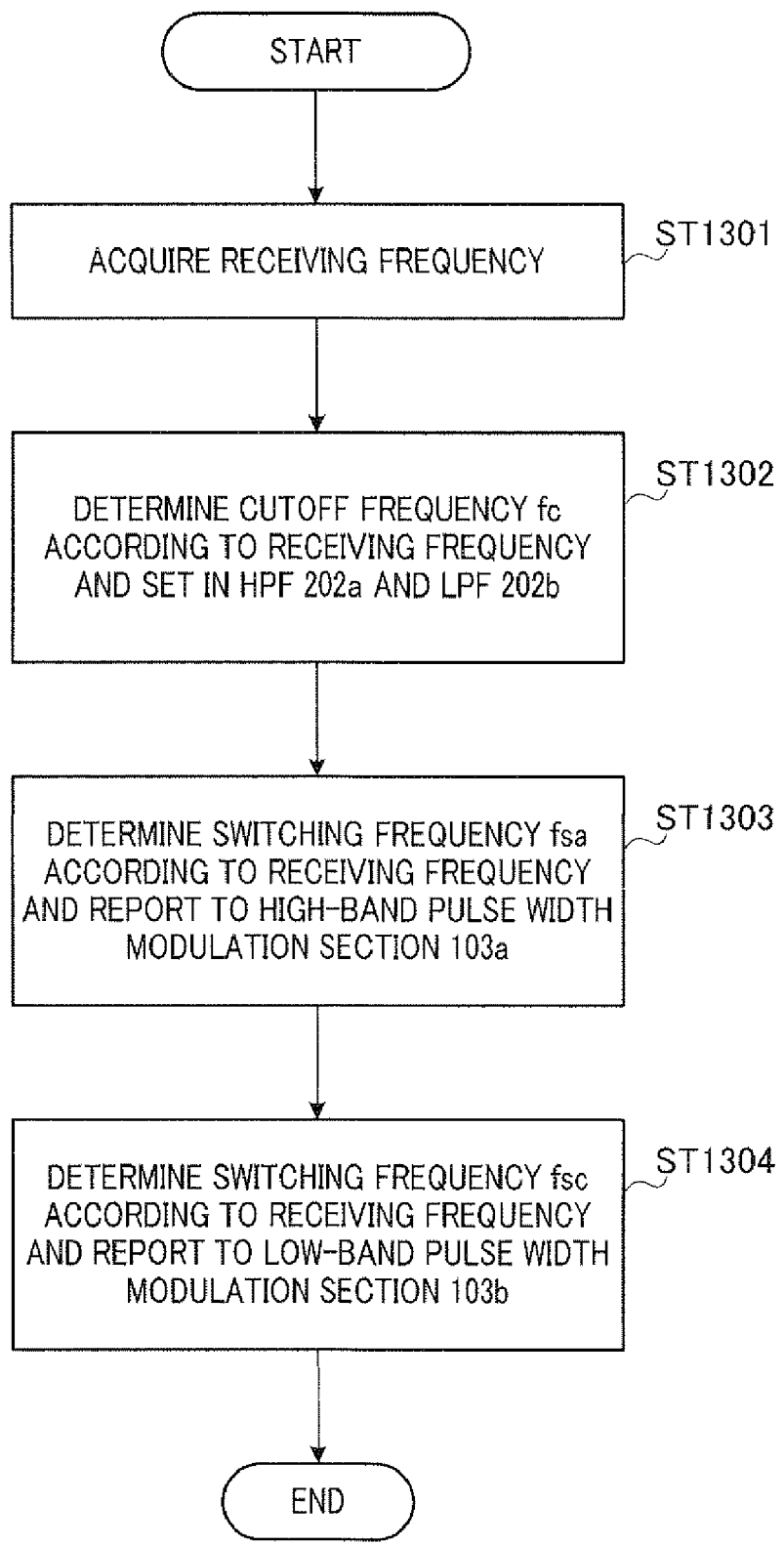
FIG. 15 is a flowchart showing processing in a switching frequency control section, a cutoff frequency control section and a switching frequency synchronization section in the digital amplifier according to Embodiment 2 of the present invention.

Referring to FIG. 15, when the processing starts, the switching frequency control section 201 and the cutoff frequency control section 203 acquire receiving frequency information from the tuner 107 (step ST1301).

Next, based on the receiving frequency information acquired from the tuner 107, the cutoff frequency control section 203 determines the cutoff frequency fc and sets the determined cutoff frequency fc in the HPF 202a and the LPF 202b (step ST1302).

Then, based on the receiving frequency information acquired from the tuner 107, the switching frequency control section 201 determines a switching frequency fsa for the higher band that is high enough not to influence the receiving frequency in the tuner 107.

The switching frequency fsa determined in the switching frequency control section 201 is sent to the switching frequency synchronization section 204 and reported to the high-band pulse width modulation section 103*a* (step ST1303).

Furthermore, based on the receiving frequency information acquired from the tuner 107, the switching frequency control section 201 determines a switching frequency fsc that is low enough not to influence the receiving frequency in the tuner 107.

The switching frequency fsc determined here is an integer fraction of the switching frequency fsa, in order to acquire synchronization between the high-band pulse width modulation section 103*a* and the low-band pulse width modulation section 103*b*.

The switching frequency fsc determined this way is sent to the switching frequency synchronization section 204 and reported to the low-band pulse width modulation section 103*b* (step ST1304).

If, in the above processing, the receiving frequency fo is, for example, 1000 kHz, the switching frequency fsc for the lower band is preferably 50 kHz or less, taking into account the influence up to the twentieth order harmonic. If the frequency of an eighth of the switching frequency fsc is a speech band that can be modulated without damaging sound quality, it is possible to make the cutoff frequency fc 6.25 kHz. Furthermore, if the receiving frequency fo is 600 kHz, the cutoff frequency fc becomes 3.75 kHz.

By the way, the switching frequencies fsa and fsc may be determined with reference to a table T that is provided in advance, as in the case of the switching frequency control section 101 in the digital amplifier 100 according to Embodiment 1, or may be determined using equations defined in advance.

In addition to the advantages of the digital amplifier 100 according to Embodiment 1, with the digital amplifier 200 having the above configuration, it is possible to select an optimal cutoff frequency fc that is suitable to the receiving frequency fo by adjusting the cutoff frequency fc in the cutoff frequency control section 203, thereby suppressing deterioration of playback performance and a decrease in the efficiency of amplification.

Furthermore, this digital amplifier 200 establishes switching synchronization by the switching frequency synchronization section 204, so that it is possible to prevent switching noise interference between the higher band and the lower band from producing beat and providing noise in the audible band.

Although a case has been presented in the above description where the received signal is divided in the band division section 202 into the higher band and the lower band, that is, where the band is divided into two, it is equally possible to divide the band into three or more.

Furthermore, although in the above description the cutoff frequency control section 203 determines a single cutoff frequency fc, this is by no means limiting, and it is equally possible to determine a plurality of varying cutoff frequencies between the HPF 202*a* and the LPF 202*b*.

The disclosure of Japanese patent application No. 2006-232442, filed on Aug. 29, 2006, including the specification, drawings and abstract, is incorporated herein by reference in its entirety.

Industrial Applicability

The digital amplifier apparatus according to the present invention can suppress the deterioration of high-band playback performance and a decrease in amplification efficiency, and is therefore suitable for use as a digital amplifier apparatus that performs amplification by a class D amplification scheme.

The invention claimed is:

1. A digital amplifier apparatus that amplifies an input signal from a tuner receiving a broadcast signal of a set receiving frequency, the digital amplifier apparatus comprising:
   a band division section that divides the input signal acquired from the set receiving frequency in the tuner into a plurality of bands;
   a pulse width modulation section that modulates the plurality of bands of the input signal divided in the band division section by a pulse width modulation scheme;
   a switching frequency control section that acquires the set receiving frequency in the tuner and controls switching frequencies in the pulse width modulation section; and
   an amplification section that amplifies the input signal subjected to pulse width modulation in the pulse width modulation section.

2. The digital amplifier apparatus according to claim 1, wherein:
   the band division section divides the input signal into a higher band and a lower band; and
   the switching frequency control section sets a relatively low first switching frequency in the pulse width modulation section for the lower band of the input signal divided in the band division section and sets a relatively high second switching frequency for the higher band of the input signal divided in the band division section, 3. The digital amplifier apparatus according to claim 2, wherein the first switching frequency and the second switching frequency assume values that do not influence the set receiving frequency in the tuner.

4. The digital amplifier apparatus according to claim 3, wherein the first switching frequency and the second switching frequency are such frequencies that both of the first and the second switching frequencies and frequencies of m/n multiples of the both switching frequencies, m and n being integers, do not overlap the set receiving frequency in the tuner, and beat noise produced by the both switching frequencies and the frequencies of the m/n multiples of the both switching frequencies, do not influence an audio band.

5. The digital amplifier apparatus according to claim 1, further comprising a cutoff frequency control section that controls a cutoff frequency in the band division section based on the set receiving frequency in the tuner.

6. The digital amplifier apparatus according to claim 1, further comprising a switching frequency synchronization section that sets switching frequencies for the lower band of the input signal divided in the band division section such that the switching frequencies are integer multiples or integer fractions of one another, and establishes switching synchronization.

7. A digital amplifier apparatus that amplifies an input signal from a tuner receiving a broadcast signal of a set receiving frequency, the digital amplifier apparatus comprising:
   a band division section that divides the input signal into a plurality of bands;
   a pulse width modulation section that modulates the bands of the input signal divided in the band division section by a pulse width modulation scheme;

a switching frequency control section that acquires the set receiving frequency in the tuner and controls switching frequencies in the pulse width modulation section;

an amplification section that amplifies the input signal subjected to pulse width modulation in the pulse width modulation section; and a cutoff frequency control section that controls a cutoff frequency in the band division section based on the set receiving frequency in the tuner.

* * * * *